United States Patent
Merritt

(10) Patent No.: US 6,356,487 B1
(45) Date of Patent: Mar. 12, 2002

(54) MEMORY DEVICE HAVING DATA PATH CONTAINING DUAL MODE FLIP-FLOP USED FOR NORMAL OPERATION AND FOR INTERNAL TESTING

(75) Inventor: Todd A. Merritt, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/644,940

(22) Filed: Aug. 23, 2000

(51) Int. Cl.[7] ............................................... G11C 7/00
(52) U.S. Cl. ............................ 365/189.05; 365/230.08
(58) Field of Search ........................... 365/189.05, 191, 365/230.08, 189.03, 189.08

(56) References Cited

U.S. PATENT DOCUMENTS 5,426,612 A * 6/1995 Ichige et al. ................. 365/220
5,659,508 A * 8/1997 Lamphier et al. ........... 365/201

* cited by examiner

Primary Examiner—Huan Hoang
Assistant Examiner—Thong Le
(74) Attorney, Agent, or Firm—Dorsey & Whitney LLP

(57) ABSTRACT

A dual-mode flip-flop includes two pairs of cross-coupled transistors functioning as a latch. The flip-flop also includes an input circuit to selectively couple either of two sets of complimentary data signals to the latch, and an output circuit to couple the latch to either a single-ended output terminal in a first mode or to a double-ended output terminal in a second mode. The flip-flop is advantageously used in the read data path of a memory device to couple single-ended data to a data output buffer in a normal operating mode. In a compressed data test mode, a pair of the flip-flops apply respective double-ended data to a data compression circuit, and the data compression circuit outputs test data to either the data output buffer or to another data compression circuit.

39 Claims, 4 Drawing Sheets

US 6,356,487 B1

MEMORY DEVICE HAVING DATA PATH CONTAINING DUAL MODE FLIP-FLOP USED FOR NORMAL OPERATION AND FOR INTERNAL TESTING

TECHNICAL FIELD

This invention relates to memory devices, and, more particularly, to a dual mode flip-flop that may be used in the data path of a memory device that is optimized to either normal operation or to compressed data testing.

BACKGROUND OF THE INVENTION

Memory devices, such as static random access memories ("SRAMs") and dynamic random access memories ("DRAMs"), each include one or more arrays of memory cells adapted to store data. The data are normally coupled to and from the memory array, and to each memory cell in the array, in complimentary form. Data are thus coupled to or from the array through an I/O line, and its compliment I/O*. For a read memory access, output data are coupled from the array through the complimentary I/O lines to a flip-flop. The flip-flop may be coupled to one of several pairs of I/O lines using a multiplexer or other switching circuitry. The flip-flop stores the output data and applies the data to an output data buffer that, in turn, couples the data to an externally accessible data bus terminal. Again, using a multiplexer or other switching circuitry, each of several flip-flops may be alternatively coupled to the data buffer.

In the past, flip-flops used as described above provided a complimentary output that was coupled to the data buffer through complimentary data lines extending from the flip-flop to the data buffer. However, these data lines must often be fairly long because of the considerable distance between the flip-flop, which is often positioned near an array, and the data buffer, which may be positioned some distance away near the periphery of a semiconductor die on which the memory device is formed. Since the value of the data can be determined from the logic level on either one of the two complimentary data lines, one of the complimentary data lines is essentially superfluous. As a result, memory devices have more recently used a single data line to couple output data from the flip flop to the data buffer. These "single-ended" data lines are used with a flip-flop having a single-ended output terminal. In contrast, "double-ended" data lines are coupled to flip-flops that provide a complimentary pair of double-ended outputs. A single-ended data path can save a significant amount of area on the surface of the semiconductor die and thus help reduce the cost of memory devices.

Although single-ended data paths can provide more efficient use of the semiconductor die surface, they are not as well suited for compressed data testing of memory devices. As is well known in the art, compressed data testing is commonly used to efficiently test memory devices during production and use. Flip-flops providing a double-ended output, which are used in a double-ended data path, are more suitable for compressed data testing. Flip-flops providing a single-ended output, which are used in single-ended data paths, require more expensive circuitry for providing the proper signals and routing them to appropriate circuitry for compressed data testing.

In the past, designers of memory devices had a choice of using either a single-ended data path to more efficiently use the surface area of the semiconductor substrate or using a double-ended data path to facilitate compressed data testing. This compromise left the resulting memory devices with either a relatively large cost or relatively little testing capability. However, it would be desirable to provide memory devices having the cost efficiencies of a single ended-data path and the compressed data testing capabilities of a double-ended data path.

SUMMARY OF THE INVENTION

A flip-flop used in the read data path of a memory device receives and latches data from a memory array. In a normal operating mode, single-ended data are coupled from the flip-flop to a data output buffer. In a test mode, double-ended data are coupled from the flip-flop to a compression circuit. The compression circuit compares the data from the flip-flop to data from another flip-flop, and outputs corresponding test data to the data output buffer. The flip-flop thus operates in either of two modes, namely a single-ended output mode or a double-ended output mode.

DETAILED DESCRIPTION OF THE INVENTION

Figure 1:
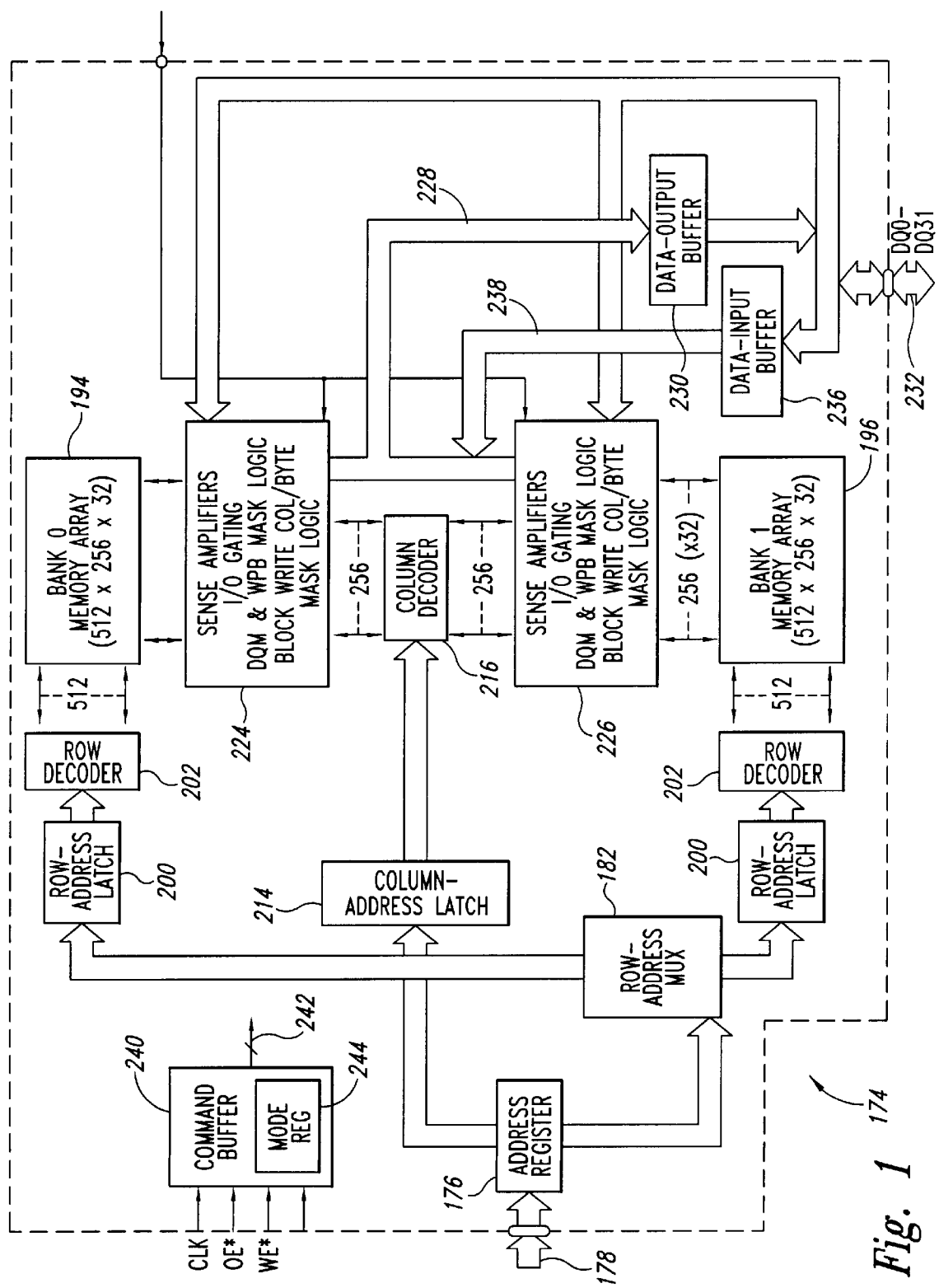
FIG. 1 is a block diagram of a synchronous DRAM ("SDRAM") that may use a single-ended data path yet still facilitate compressed data testing in accordance with an embodiment of the invention.

FIG. 1 is a simplified block diagram of an synchronous dynamic random access memory ("SDRAM") 174 in accordance with an embodiment of the present invention. The SDRAM 174 includes an address register 176 that receives either a row address or a column address on an address bus 178. The address bus 178 is generally coupled to a memory controller (not shown in FIG. 1). Typically, a row address is initially received by the address register 176 and is applied to a row address multiplexer 182. The row address multiplexer 182 couples the row address to a number of components associated with either of two memory banks 194, 196 depending upon the state of a bank address bit forming part of the row address. Associated with each of the memory banks 194, 196 is a respective row address latch 200 which stores the row address, and a row decoder 202 which applies various signals to its respective memory bank 194 or 196 as a function of the stored row address.

After the row address has been applied to the address register 176 and stored in one of the row address latches 200, a column address is applied to the address register 176. The address register 176 couples the column address to a column address latch 214. The column address from the column address latch 214 is decoded by a column address decoder 216 to address a specific column or columns. The row address corresponds to one or more of word lines (not shown) of the arrays 194, 196, and the column address corresponds to one or more columns of the arrays 194, 196.

Data to be read from one of the memory banks 194, 196 are coupled to column circuitry 224, 226 for one of the arrays 194, 196, respectively. The data are then coupled through a read data path 228 to a data output buffer 230, which applies the data to a data bus 232. Data to be written to one of the memory banks 194, 196 are coupled from the data bus 232 to the column circuitry 224, 226 through a data input register 236 and a write data path 238. The data are then transferred to one of the memory banks 194, 196, respectively.

The operation of the SDRAM 174 is controlled by various command signals that are coupled to a command buffer 240. The command buffer 240 captures these command signals using a clock CLK signal and then generates appropriate control signals on respective signal lines 242. The command buffer 240 also includes a mode register 244 that can store values corresponding to respective operating modes. The mode register 244 is set to one of several values by asserting corresponding combinations of the command signals. One of these values corresponds to an internal compressed data test operating mode. The control signals from the command buffer 240 then control the operation of the components in the syhronous SDRAM 174 to test memory cells in the memory-cell arrays 194, 196 by compressing data read from the arrays 194, 196, as explained in greater detail below.

Figure 2:
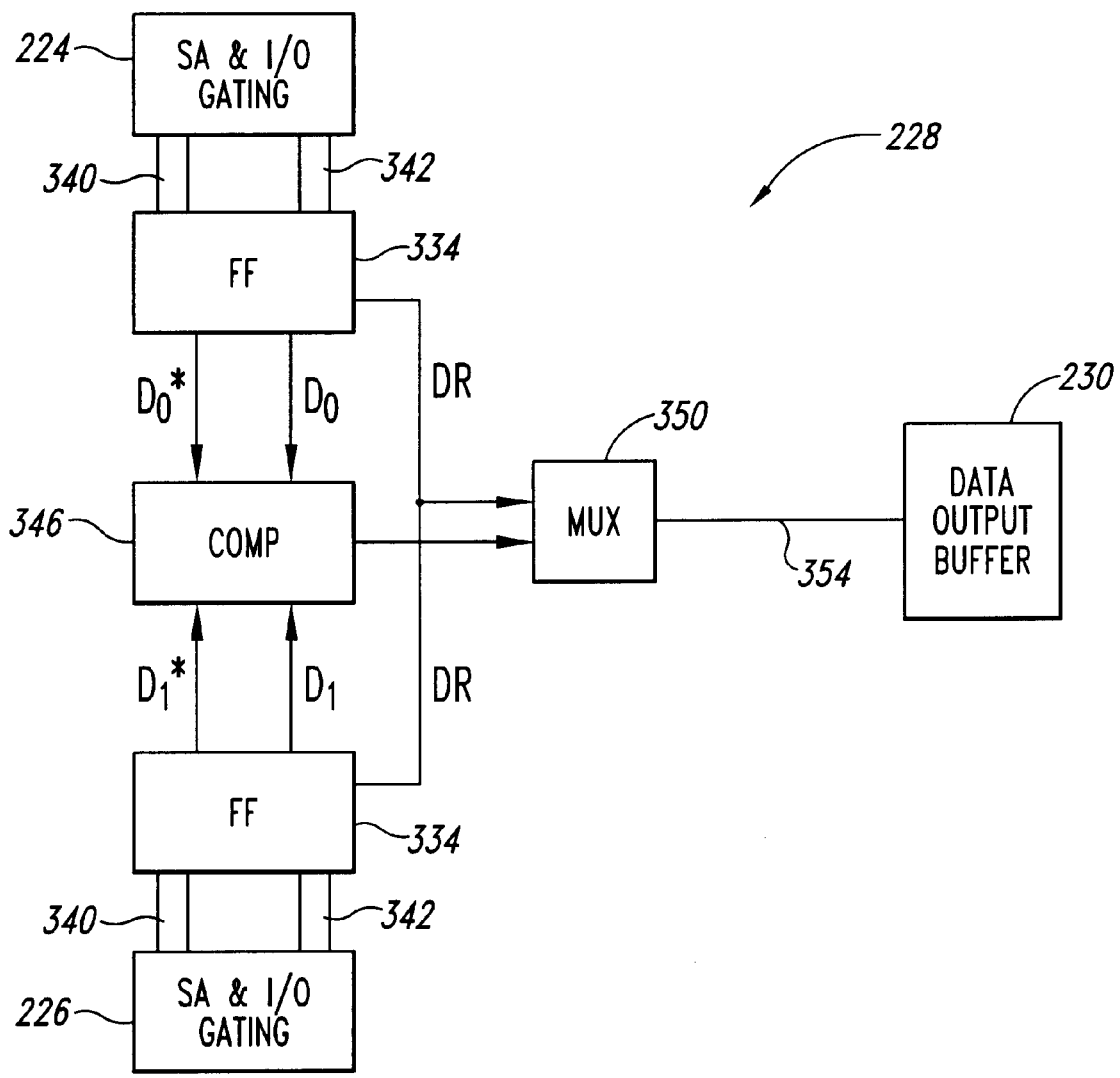
FIG. 2 is a block diagram of a read data path according to an embodiment of the invention that may be used in the SDRAM of FIG. 1.

FIG. 2 shows an embodiment of the read data path 228 coupling the sense amplifiers and I/O gating 224, 226 to the data output buffer 230 in the SDRAM 174 of FIG. 1. The sense amplifiers and I/O gating 224, 226 are coupled to respective flip-flops 334 by two pairs of complimentary input/output ("I/O") lines 340, 342. The flip-flops 334 each generate a double-ended outputs $D_0$, $D_{0\_}$ and $D_1$, $D_{1\_}$, respectively, at a pair of double-ended output terminals. The double-ended outputs $D_0$, $D_{0\_}$ and $D_1$, $D_{1\_}$ are applied to respective inputs of a conventional data compression circuit 346. The flip-flops 334 each generate a single-ended output DR at a single-ended output terminal that are coupled to each other and to one input of a multiplexer 350. A second input of the multiplexer 350 is coupled to an output of the data compression circuit 346. The output of the multiplexer 350 is coupled though a single-ended data path 354 to the data output buffer 230. The multiplexer 350 and the circuitry "upstream" from the multiplexer 350 are preferably located fairly close to the memory cell arrays 194, 196 (FIG. 1). As a result, the single-ended data path 354 may be relatively long. However, since the data path 354 is single-ended, it requires only about half of the area of the substrate that a double-ended data path would require.

In operation, the read data path 228 can operate in either a normal mode or a test mode. The data path is switched between these two modes by an appropriate control signal generated by the mode register 244 (FIG. 1), as explained above. In the normal operating mode, both of the flip-flops 334 receive complimentary outputs from one of the two pairs of I/O lines 340, 342. One of the flip-flops 334 applies a logic level to its single-ended output terminal, and the single-ended output terminal of the other flip-flop 334 is placed in a high impedance or "tri-state"condition. In the normal operating mode, the multiplexer 350 is operable to couple the signal from the single-ended terminal of either of the flip-flops 334 to the data output buffer 230 through the single-ended data path 354.

In the test mode, the flip-flops 334 each generate double-ended outputs $D_0$, $D_{0\_}$ and $D_1$, $D_{1\_}$, which are applied to respective inputs of the data compression circuit 346. The compression circuit 346 then generates a predetermined logic level if the data from the flip-flops 334 correspond to data that should be read from the memory cell arrays 194, 196 (FIG. 1) if the SDRAM is working properly. The compression circuit 346 is conventional, as is the manner in which it can determine if the proper data are being read from the arrays 194, 196. Therefore, in the interest of brevity, the circuitry used to implement the compression circuit 346 will not be shown or described further. In the test mode, the multiplexer 350 is operable to couple the signal from the data compression circuit 346 to the data output buffer 230 through the single-ended data path 354.

Figure 3A:
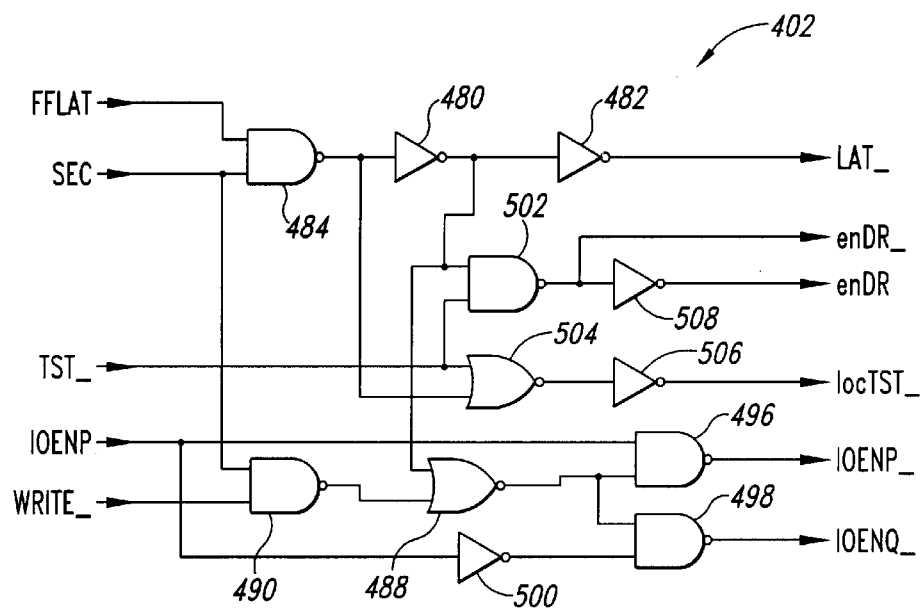
FIGS. 3A and 3B are logic diagrams of a dual mode flip-flop according to one embodiment of the invention that may be used in the data path of FIG. 2.
Figure 3B:
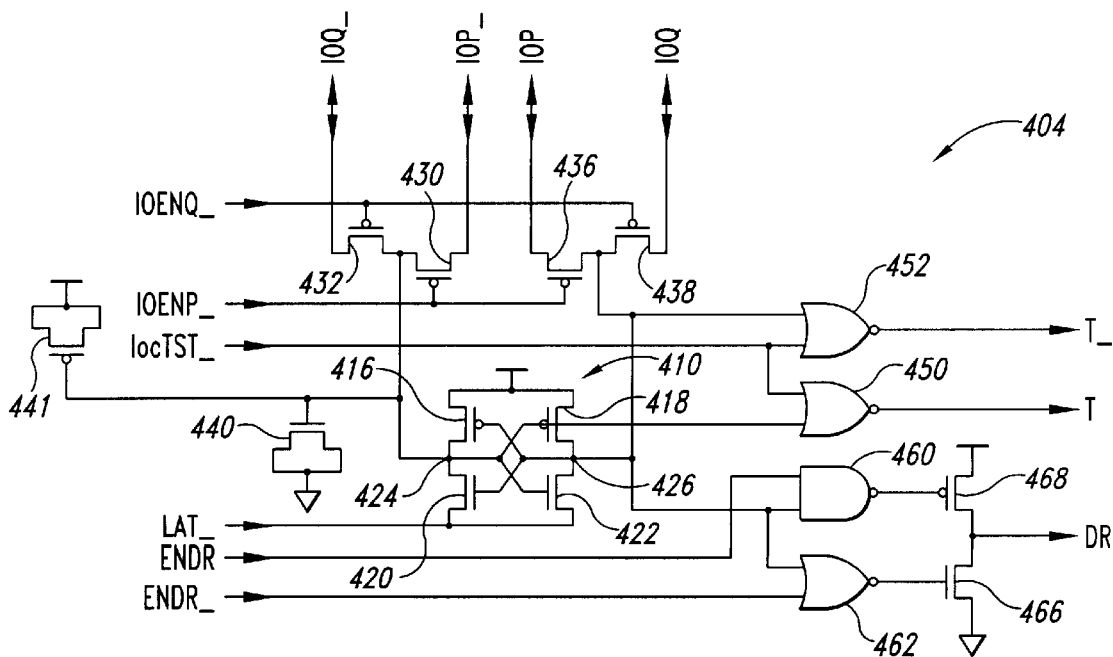

The read data path 228 is able to function in the advantageous manner explained above because the flip-flops 334 are capable of operating in either a single-ended mode or a double-ended mode. One embodiment of a dual mode flip-flop that may be used for the flip-flops 334 in the read data path of FIG. 2 is shown in FIG. 3. The flip-flop includes a control circuit 402, which is shown in FIG. 3A, and a flip-flop circuit 404, which is shown in FIG. 3B. With reference to FIG. 3B, the flip-flop circuit 404 includes a latch 410 formed by a pair of cross-coupled PMOS transistors 416, 418, and a pair of cross-coupled and NMOS transistors 420, 422. The latch 410 has a first input/output ("I/O") node 424 and a second I/O node 426.

In operation, when the first I/O node 424 is low, the PMOS transistors 418 is turned ON, thereby driving the second I/O node high. The high at the second I/O node 426 turns ON the NMOS transistor 420, thereby driving the first I/O node low. A high may be latched to the first I/O node 424 and a low latched to the second I/O node 426 in a similar manner.

Either a first inverted input signal IOP_ or a second inverted input signal IOQ_ is coupled to the first I/O node 424 through respective PMOS transistors 430, 432. Similarly, either a first non-inverted input signal IOP or a second non-inverted input signal IOQ is coupled to the second I/O node 426 through respective PMOS transistors 436, 438. The first input signals IOP_ are coupled to the latch 410 when a respective enable signal IOENP_ is active low, and the second input signals IOQ, IOQ_ are coupled to the latch 410 when a respective enable signal IOENQ_ is active low. As explained in greater detail below, the enable signals IOENP_ and IOENQ_ are generated by the control circuit 402 shown in FIG. 3A, and they are never both low at the same time. The output impedance of the circuitry in the control circuit 402 generating these input signals is sufficiently low to overcome the driving impedance of the transistors 416–422. For example, when the second I/O node 426 is high, a low IOP signal is coupled through the transistor 436 with a sufficiently low impedance to drive the second I/O node 426 low despite the PMOS transistor 418 being turned ON.

As also shown in FIG. 3B, the first I/O node 424 is coupled to the gate of an NMOS transistor 440, which has its source and drain coupled to ground to act as a capacitor. Similarly, the first I/O node 424 is coupled to the gate of a PMOS transistor 441, which has its source and drain coupled to a power supply voltage to act as a capacitor. The capacitance of the transistors 440, 441 causes the capacitance at node 424 to match the capacitance at node 426 resulting from the input capacitance of the gates 460, 462. More specifically, the sources of the NMOS transistors 420, 422 are coupled to an active low latch input, LAT_, which must be low to activate the latch 410. In operation, the LAT_ signal is initially high when either the transistors 430, 436 are turned ON or the transistors 432, 438 are turned ON to couple an input signal to the I/O nodes 424, 426. The transistors 430, 436 are also turned OFF and the LAT_ signal transitions active low to latch the input signals applied to the I/O nodes 424, 426.

The first I/O node 424 is coupled to an input of a first NOR gate 450, and the second I/O node 426 is coupled to an input of a second NOR gate 452. The NOR gates 450, 452 function as inverters when they are enabled by an active low local test signal, locTST__. Since an input of each NOR gate 450, 452 is coupled to a respective complementary output of the latch 410, the NOR gates 450, 452 generate complimentary or "double-ended" outputs T and T__. More specifically, the logic level at the T output is the same as the logic level at the first I/O node 424, and the logic level at the T__ output is the same as the logic level at the second I/O node 426. However, since locTST__ is low only during the test mode, the flip-flop circuit 404 generates a double-ended output only in the test mode. During the normal operating mode when the locTST__ signal is high, the T and T__ signals are both low.

The second I/O node 426 is also applied to a NAND gate 460 and a NOR gate 462. These gates are enabled by an active high ENDR signal applied to the NAND gate 460 and an active low ENDR__ signal applied to the NOR gate 462. When enabled, the NAND gate 460 and the NOR gate 462 function to invert the logic level present at the second I/O node 426. Thus, when the second I/O node 426 is low, the NOR gate 462 outputs a high to turn ON an NMOS transistor 466, thereby driving the output DR low. At the same time, the NAND gate 460 generates a high output to turn off a PMOS transistor 468. When the second I/O node 426 is high, the NAND gate 460 outputs a low to turn ON the PMOS transistor 468, and the NOR gate 462 outputs a low to turn OFF the NMOS transistor 466, thereby driving the output DR high. Thus, in the normal operating mode when the gates 460, 462 are enabled, the flip-flop circuit 404 generates a "single-ended" output DR. During the test mode when the gates 460, 462 are disabled, the NOR gate 460 generates a high to turn OFF the PMOS transistor 468. At the same time, the NOR gate 462 generates a low to turn OFF the NMOS transistor 466. As a result, in the test mode, the single-ended output DR is placed at a high impedance or "tri-state" condition.

In summary, either of two sets of complementary input signals IOP, IOP__ or IOQ, IOQ__ are first coupled to the latch 410. The latch signal LAT__ then transitions active low to isolate the inputs from the latch 410 and enable the latch 410 to store a logic level corresponding to the inputs. A single-ended output corresponding to the state of the latch 410 is then applied to the DR output in the normal operating mode, and a double-ended output corresponding to the state of the latch 410 is applied to the T and T__ outputs in the test mode.

As mentioned above, the control circuit 402 for the flip-flop circuit 404 is shown in FIG. 3A. The latch signal LAT__ is generated at the output of a series of two inverters 480, 482, the first of which, inverter 480, is coupled to the output of a NAND gate 484. The NAND gate 484 is enabled by a high SEC signal whenever the section of the memory device serviced by the flip-flop 400 is active. Thus, when SEC is active high, the LAT__ output corresponds to the complement of a flip-flop latch signal, FFLAT, which is generated by appropriate circuitry in the memory device.

As mentioned above, the input signals IOP, IOP__ or IOQ, IOQ__, are coupled to the latch 410 (FIG. 3B) until the LAT__ output transitions active low. Before that time, the low at the output of the inverter 480 enables a NOR gate 488, which receives the output of a NAND gate 490. The NAND gate 490 is, in turn, enabled by the high SEC signal whenever the memory device serviced by the flip-flop 400 is active. The other input of the NAND gate 490 is coupled to an active low WRITE__ signal. Thus, during a read memory operation when data are coupled through the read data path, the WRITE__ signal is inactive high, thereby causing the NAND gate 490 to output a low and the enabled NOR gate 488 to output a high. This high at the output of the NOR gate 488 enables the NAND gates 496, 498. The NAND gate 496 receives an input enable signal IOENP while the NAND gate 498 receives its complement IOENP__ through an inverter 500. These signals, like the other signals applied to the control circuit 402, are generated by appropriate circuitry in the SDRAM 174 (FIG. 1). Thus, during a read operation before the FFLAT signal has transitioned high, one of the sets of input signals IOP, IOP__ or IOQ, IOQ__ is coupled to the latch 410, depending upon the logic level of the IOENP signal. When IOENP is high, the NAND gate 496 outputs an active low IOENP__ signal to couple the IOP, IOP__ input signals to the latch 410. When IOENP is low, the NAND gate 498 outputs an active low IOENQ__ signal to couple the IOQ, IOQ__ input signals to the latch 410. When the FFLAT signal transitions high, the high at the output of the inverter 480 disables the NOR gate 488, which, in turn disables the NAND gates 496, 498. The NAND gates 496, 498 then output an active high IOENP__ and IOENQ__ signals to isolate the IOP, IOP__ and IOQ, IOQ__ signals from the latch 410.

As also mentioned above, when the LAT__ signal transitions active low, the single-ended or double-ended output signals DR or T, T__, respectively, are generated. At this time, the high at the output of the inverter 480 enables a NAND gate 502, and the low at the output of the NAND gate 484 enables a NOR gate 504. Thus, the gates 502, 504 function to invert the test signal, TST__. When the TST__ signal is active low, the NOR gate 504 outputs a high, which causes an inverter 506 to output an active low LOCTST__ signal. As explained above with reference to FIG. 3B, the active low LOCTST__ signal enables the flip-flop circuit 404 to generate double-ended output signals T, T__. At the same time, the active low TST__ signal causes the NAND gate 502 to output an inactive high ENDR__ signal which, in turn, causes an inverter 508 to output an inactive low ENDR signal. As also explained above with reference to FIG. 3B, the inactive ENDR and ENDR__ signals place the single-ended output DR in a tri-state condition.

When the TST__ signal is inactive high, the NOR gate 504 is disabled and the NAND gate 502 is enabled. As a result, the LOCTST__ signal is inactive high and the ENDR and ENDR__ signals are active high and active low, respectively. This condition causes the double-ended outputs T, T__ to both be low and the single-ended output DR to have a value corresponding to the state of the latch 410. The flip-flop 400 in accordance with one embodiment of the invention is thus able to generate either a single-ended output, which is used in the normal operating mode, or a double-ended output, which is used in the test mode.

Figure 4:
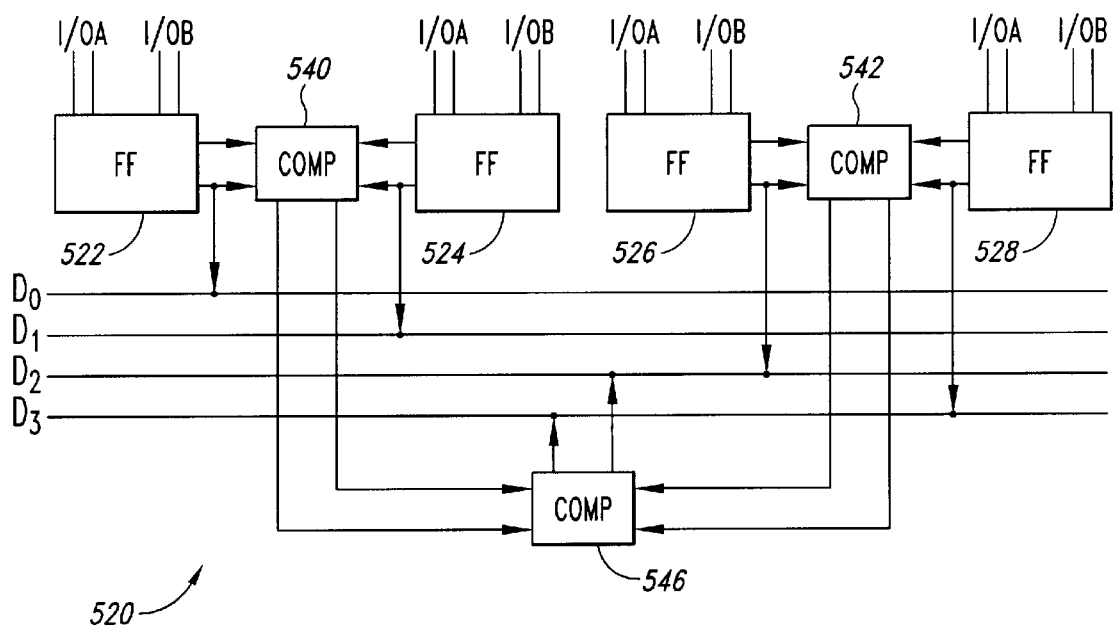
FIG. 4 is a block diagram of another embodiment of a read data path that uses several of the flip-flops shown in FIG. 3, which may be used in the SDRAM of FIG. 1.

FIG. 4 is a block diagram of another embodiment of a portion of a read data path 520 having a compressed data testing system. The data path 520 includes four flip-flops of the type shown in FIGS. 3A and 3B. Each flip-flop 522–28 receives two respective pairs of input signals on complementary I/O lines. Each flip-flop 522–28 has a single-ended output coupled to a respective data line $D_0$–$D_3$, and a double-ended output coupled to compression circuits 548, 542 shared by adjacent flip-flops 522, 524 and 526, 528, respectively. The compression circuits 540, 542, in turn, each have a double-ended output coupled to respective complementary inputs of a final compression circuit 546. The compression circuit 546 has a double-ended output coupled to two of the data lines $D_2$, $D_3$.

In operation during the test mode, the flip-flops 522–28 each latch a complementary data bit and generate a double-ended output that is compared to the double-ended output of the adjacent flip-flop. For example, data may be written to the memory device so that the complementary data on each I/O line corresponds to logic "1". If the memory device is operating properly, the data bit latched by each flip-flop 522–28 will thus be a logic "1". Each compression circuit 540, 542 may then generate a double-ended output corresponding to a logic "1". The final compression circuit may, in turn, generate a double-ended output corresponding to a logic "1". If, however, one of the flip-flops 522–28 outputs a double-ended output corresponding to a logic "0", the compression circuit to which it is connected may generate an output corresponding to a logic "0". As a result, the final compression circuit 546 may generate a double-ended output corresponding to a logic "0".

Figure 5:
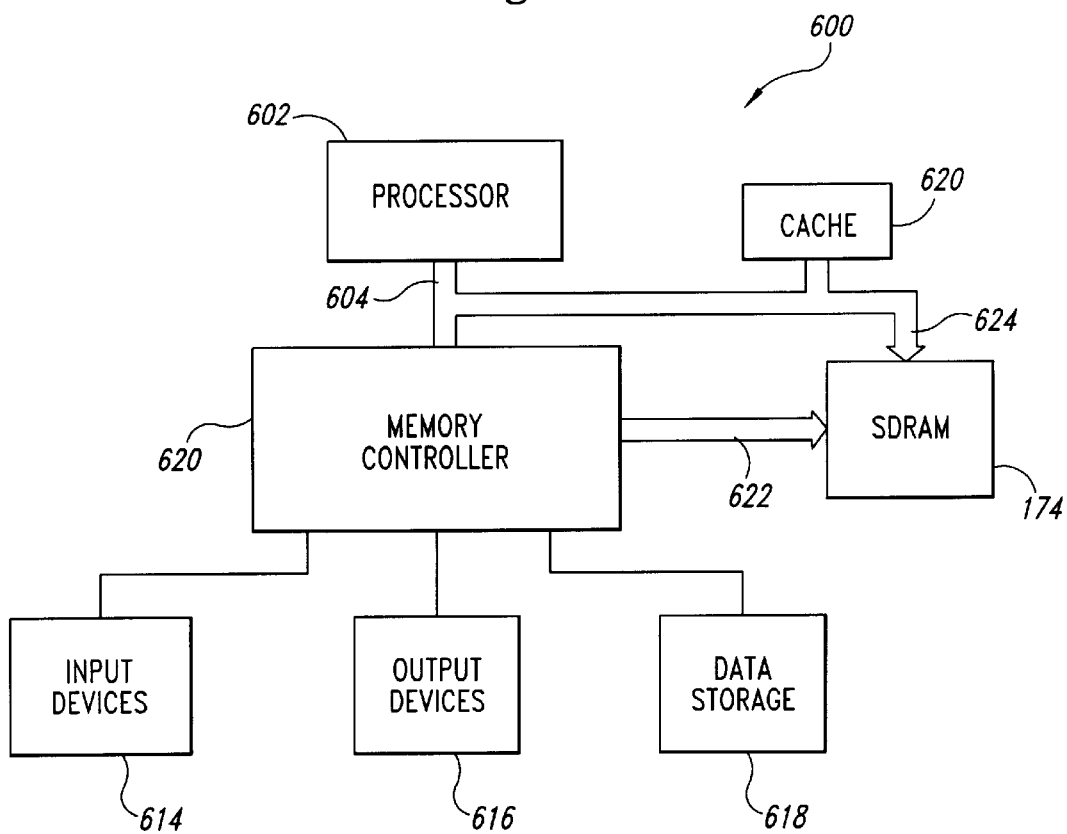
FIG. 5 is a block diagram of a computer system that may use the SDRAM of FIG. 1 containing one or more of the dual mode flip-flops shown in FIG. 3.

FIG. 5 is a simplified block diagram of a computer system 600 including one or more SDRAMs 174 using the flip-flops 400 shown in FIGS. 3A and 3B. The computer system 600 includes a processor 602 for performing various computing functions, such as executing specific software to perform specific calculations or tasks. The processor 602 includes a processor bus 604 that normally includes an address bus, a control bus, and a data bus.

In addition, the computer system 600 includes one or more input devices 614, such as a keyboard or a mouse, coupled to the processor 602 to allow an operator to interface with the computer system 600. Typically, the computer system 600 also includes one or more output devices 616 coupled to the processor 602, such output devices typically being a printer or a video terminal. One or more data storage devices 618 are also typically coupled to the processor 602 to allow the processor 602 to store data or retrieve data from internal or external storage media (not shown). Examples of typical storage devices 618 include hard and floppy disks, tape cassettes and compact disk read-only memories (CD-ROMs).

The processor 602 is also typically coupled to cache memory 620, which is usually an SRAM, by the processor bus 604 and to the DRAM 174 through a memory controller 620. The memory controller 620 normally includes a control and address bus 622 that is coupled to the DRAM 174. A data bus 624 is typically coupled directly to a data bus portion of the processor bus 604.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A dual mode flip-flop, comprising:
    a latch having at least one input/output ("I/O") terminal, the latch being structured to latch a signal applied to the I/O terminal;
    an input circuit coupled to the I/O terminal of the latch, the input circuit being structured to couple the data signal to the I/O terminal; and
    an output circuit coupled between the I/O terminal of the latch and the single-ended and double-ended output terminals, the output circuit being structured to couple the I/O terminal to the single-ended output terminal responsive to a first mode signal, and to couple the I/O terminal to at least one of the double-ended output terminals responsive to receiving a second mode signal, the output circuit comprising:
        a pair of double-ended output drivers having respective input terminals coupled to the latch and respective output terminals coupled to one of the double-ended output terminals, the double-ended output driver being enabled responsive to the second mode signal; and
        a single-ended output driver having an input terminal coupled to the latch and an output terminal coupled to the single-ended output terminal, the single-ended output driver being enabled responsive to the first mode signal.

2. The flip-flop of claim 1 wherein the single-ended output driver comprises:
    a first gate enable by the first mode signal and disabled by the second mode signal, the first gate having an output terminal and an input terminal coupled to the I/O terminal of the latch;
    a second gate enable by the first mode signal and abled by the second mode signal; the second gate having an output terminal and an input terminal coupled to the I/O terminal of the latch;
    a first transistor coupled between a first voltage reference node and the single-ended output terminal, the first transistor having a control terminal coupled to the output terminal of the first gate; and
    a second transistor coupled between the single-ended output terminal and a second voltage reference node, the second transistor having a control terminal coupled to the output terminal of the second gate.

3. A dual mode flip-flop, comprising:
    a flip flop circuit comprising:
        a latch having at least one input/output ("I/O") terminal, the latch being structured to latch a signal applied to the I/O terminal responsive to a latch enable signal;
        an input circuit coupled to the I/O terminal of the latch, the input circuit being structured to couple the data signal to the I/O terminal responsive to an input enable signal; and
        an output circuit coupled between the I/O terminal of the latch and the single-ended and double-ended output terminals, the output circuit being structured to couple the I/O terminal to the single-ended output terminal responsive to receiving both a first mode signal and a first output enable signal and to couple the I/O terminal to at least one of the double-ended output terminals responsive to receiving both a second mode signal and a second output enable signal, the output circuit comprising:
            a pair of double-ended output drivers having respective input terminals coupled to the latch and respective output terminals coupled to one of the double-ended output terminals, the double-ended output driver being enabled responsive to the second mode signal; and
            a single-ended output driver having an input terminal coupled to the latch and an output terminal coupled to the single-ended output terminal, the single-ended output driver being enabled responsive to the first mode signal.

a flip-flop control circuit, comprising:
  a mode control circuit coupled to receive the first and second control signals, the mode control circuit being structured to generate the first mode signal responsive to the first control signal and to generate the second mode signal responsive to the second control signal; and
  a latch control circuit coupled to the latch and to the input and output circuits, the latch control circuit being structured to generate the input enable signal responsive to a first latch control signal, and to generate the output enable signal and the latch enable signal responsive to a second latch control signal.

4. The flip-flop of claim 3 wherein the single-ended output driver comprises:
  a first gate enable by the first mode signal and disabled by the second mode signal, the first gate having an output terminal and an input terminal coupled to the I/O terminal of the latch;
  a second gate enable by the first mode signal and disabled by the second mode signal; the second gate having an output terminal and an input terminal coupled to the I/O terminal of the latch;
  a first transistor coupled between a first voltage reference node and the single-ended output terminal, the first transistor having a control terminal coupled to the output terminal of the first gate; and
  a second transistor coupled between the single-ended output terminal and a second voltage reference node, the second transistor having a control terminal coupled to the output terminal of the second gate.

5. A dual mode flip-flop, comprising:
  latch means for latching a signal applied to the flip-flop;
  first output means coupled to the latch means, the first output means coupling a signal from the latch means to a single-ended output terminal when the flip-flop is operating in a first mode; and
  second output means coupled to the latch means, the second output means coupling complimentary signals from the latch means to respective double-ended output terminals when the flip-flop is operating in a second mode.

6. The flip-flop of claim 5 wherein the first output means includes means for placing the single-ended output terminal in a high impedance state when the flip-flop is operating in the second mode.

7. The flip-flop of claim 5 further comprising input means for selectively coupling either of two signals applied to the flip-flop.

8. A memory device read data path coupling read data from a memory array to a data output buffer, the read data path comprising:
  a flip flop having at least one input terminal coupled to receive a data signal from the memory array, a single-ended output terminal, a pair of double-ended output terminals, and a control terminal, the flip flop being structured to generate a single-ended output signal at the single-ended output terminal responsive to a first control signal applied to the control terminal, and being structured to generate a double-ended output signal at each of the double-ended output terminals responsive to a second control signal applied to the control terminal, the single-ended output terminal being coupled to an input terminal of the data output buffer;
  a test mode circuit having an output coupled to the control terminal of the flip-flop, the test mode circuit being structured to generate the first control signal in a normal operating mode and the second control signal in a test mode; and
  a compression circuit having a pair of complimentary input terminals coupled to the double-ended output terminals of the flip-flop, the compression circuit having at least one output terminal coupled to an input terminal of the data output buffer.

9. The read data path of claim 8 wherein the memory array produces complimentary data signals, and wherein the flip-flop comprises a pair of complimentary input terminals coupled to receive the complimentary data signals from the memory array.

10. The read data path of claim 8 wherein the data output buffer comprises complimentary input terminals, and wherein the compression circuit comprises a pair of double-ended output terminals coupled to the complimentary input terminals of the data output buffer.

11. The read data path of claim 8 wherein the flip-flop comprises:
  a flip flop circuit comprising:
    a latch having at least one input/output ("I/O") terminal, the latch being structured to latch a signal applied to the I/O terminal responsive to a latch enable signal;
    an input circuit coupled to the I/O terminal of the latch, the input circuit being structured to couple the data signal to the I/O terminal responsive to an input enable signal; and
    an output circuit coupled between the I/O terminal of the latch and the single-ended and double-ended output terminals, the output circuit being structured to couple the I/O terminal to the single-ended output terminal responsive to receiving both a first mode signal and a first output enable signal and to couple the I/O terminal to at least one of the double-ended output terminals responsive to receiving both a second mode signal and a second output enable signal; and
  a flip-flop control circuit, comprising:
    a mode control circuit coupled to receive the first and second control signals, the mode control circuit being structured to generate the first mode signal responsive to the first control signal and to generate the second mode signal responsive to the second control signal; and
    a latch control circuit coupled to the latch and to the input and output circuits, the latch control circuit being structured to generate the input enable signal responsive to a first latch control signal, and to generate the output enable signal and the latch enable signal responsive to a second latch control signal.

12. The read data path of claim 8 wherein the flip-flop comprises:
  a latch having at least one input/output ("I/O") terminal, the latch being structured to latch a signal applied to the I/O terminal;
  an input circuit coupled to the I/O terminal of the latch, the input circuit being structured to couple the data signal to the I/O terminal; and
  an output circuit coupled between the I/O terminal of the latch and the single-ended and double-ended output terminals, the output circuit being structured to couple the I/O terminal to the single-ended output terminal responsive to a first mode signal, and to couple the I/O terminal to at least one of the double-ended output terminals responsive to receiving a second mode signal.

13. The read data path of claim 12 where the output circuit comprises:
   a pair of double-ended output drivers having respective input terminals coupled to the latch and respective output terminals coupled to one of the double-ended output terminals, the double-ended output driver being enabled responsive to the second mode signal; and
   a single-ended output driver having an input terminal coupled to the latch and an output terminal coupled to the single-ended output terminal, the single-ended output driver being enabled responsive to the first mode signal.

14. The read data path of claim 13 wherein the single-ended output driver comprises:
   a first gate enable by the first mode signal and disabled by the second mode signal, the first gate having an output terminal and an input terminal coupled to the I/O terminal of the latch;
   a second gate enable by the first mode signal and disabled by the second mode signal; the second gate having an output terminal and an input terminal coupled to the I/O terminal of the latch;
   a first transistor coupled between a first voltage reference node and the single-ended output terminal, the first transistor having a control terminal coupled to the output terminal of the first gate; and
   a second transistor coupled between the single-ended output terminal and a second voltage reference node, the second transistor having a control terminal coupled to the output terminal of the second gate.

15. A memory device read data path coupling read data from a memory array to a data output buffer, the read data path comprising:
   a plurality of flip flops, each of the flip-flops comprising at least one input terminal coupled to receive a respective data signal from the memory array, a single-ended output terminal, a pair of double-ended output terminals, and a control terminal, each of the flip flops being structured to generate a respective single-ended output signal at the single-ended output terminal responsive to a first control signal applied to the control terminal, and being structured to generate a double-ended output signal at each of the double-ended output terminals responsive to a second control signal applied to the control terminal, the single-ended output terminal of each flip-flop being coupled to a respective input terminal of the data output buffer;
   a test mode circuit having an output coupled to the control terminal of the flip-flop, the test mode circuit being structured to generate the first control signal in a normal operating mode and the second control signal in a test mode; and
   a compression circuit having two pairs of complimentary input terminals, each pair of complimentary input terminals being coupled to the double-ended output terminals of a respective one of the flip-flops, the compression circuit having at least one output terminal coupled to an input terminal of the data output buffer.

16. The read data path of claim 15 wherein the memory array produces complimentary data signals, and wherein each of the flip-flops comprise a pair of complimentary input terminals coupled to receive the complimentary data signals from the memory array.

17. The read data path of claim 15 wherein the data output buffer comprises complimentary input terminals, and wherein the compression circuit comprises a pair of double-ended output terminals coupled to the complimentary input terminals of the data output buffer.

18. The read data path of claim 15 wherein each of the flip-flops comprise:
   a flip flop circuit comprising:
      a latch having at least one input/output ("I/O") terminal, the latch being structured to latch a signal applied to the I/O terminal responsive to a latch enable signal;
      an input circuit coupled to the I/O terminal of the latch, the input circuit being structured to couple the data signal to the I/O terminal responsive to an input enable signal; and
      an output circuit coupled between the I/O terminal of the latch and the single-ended and double-ended output terminals, the output circuit being structured to couple the I/O terminal to the single-ended output terminal responsive to receiving both a first mode signal and a first output enable signal and to couple the I/O terminal to at least one of the double-ended output terminals responsive to receiving both a second mode signal and a second output enable signal; and
   a flip-flop control circuit, comprising:
      a mode control circuit coupled to receive the first and second control signals, the mode control circuit being structured to generate the first mode signal responsive to the first control signal and to generate the second mode signal responsive to the second control signal; and
      a latch control circuit coupled to the latch and to the input and output circuits, the latch control circuit being structured to generate the input enable signal responsive to a first latch control signal, and to generate the output enable signal and the latch enable signal responsive to a second latch control signal.

19. The read data path of claim 15 wherein each of the flip-flops comprise:
   a latch having at least one input/output ("I/O") terminal, the latch being structured to latch a signal applied to the I/O terminal;
   an input circuit coupled to the I/O terminal of the latch, the input circuit being structured to couple the data signal to the I/O terminal; and
   an output circuit coupled between the I/O terminal of the latch and the single-ended and double-ended output terminals, the output circuit being structured to couple the I/O terminal to the single-ended output terminal responsive to a first mode signal, and to couple the I/O terminal to at least one of the double-ended output terminals responsive to receiving a second mode signal.

20. A memory device, comprising:
   at least one array of memory cells adapted to store data at a location determined by an address;
   an address circuit adapted to receive and decode an address, and select a plurality of memory cells corresponding to the address;
   a command buffer adapted to receive a memory command and to generate control signals corresponding thereto;
   a write data path adapted to couple data from an external data terminal to the at least one array of memory cells; and
   a read data path adapted to couple data from the at least one array of memory cells to the external data terminal, the read data path comprising:

a data output buffer having at least one input terminal and an output terminal coupled to the external data terminal;

a flip flop having at least one input terminal coupled to receive a data signal from the at least one array of memory cells, a single-ended output terminal, a pair of double-ended output terminals, and a control terminal, the flip flop being structured to generate a single-ended output signal at the single-ended output terminal responsive to a first control signal applied to the control terminal, and being structured to generate a double-ended output signal at each of the double-ended output terminals responsive to a second control signal applied to the control terminal, the single-ended output terminal being coupled to the input terminal of the data output buffer;

a test mode circuit having an output coupled to the control terminal of the flip-flop, the test mode circuit being structured to generate the first control signal in a normal operating mode and the second control signal in a test mode; and a compression circuit having a pair of complimentary input terminals coupled to the double-ended output terminals of the flip-flop, the compression circuit having at least one output terminal coupled to an input terminal of the data output buffer.

21. The memory device of claim 20 wherein the command buffer further comprises a mode register structured to store data corresponding to an operating mode, and wherein the mode register is operable to generate the first and second control signals.

22. The memory device of claim 20 wherein the at least one array of memory cells produces complimentary data signals, and wherein the flip-flop comprises a pair of complimentary input terminals coupled to receive the complimentary data signals from the at least one array of memory cells.

23. The memory device of claim 20 wherein the data output buffer comprises complimentary input terminals, and wherein the compression circuit comprises a pair of double-ended output terminals coupled to the complimentary input terminals of the data output buffer.

24. The memory device of claim 20 wherein the flip-flop comprises:

a flip flop circuit comprising:

a latch having at least one input/output ("I/O") terminal, the latch being structured to latch a signal applied to the I/O terminal responsive to a latch enable signal;

an input circuit coupled to the I/O terminal of the latch, the input circuit being structured to couple the data signal to the I/O terminal responsive to an input enable signal; and an output circuit coupled between the I/O terminal of the latch and the single-ended and double-ended output terminals, the output circuit being structured to couple the I/O terminal to the single-ended output terminal responsive to receiving both a first mode signal and a first output enable signal and to couple the I/O terminal to at least one of the double-ended output terminals responsive to receiving both a second mode signal and a second output enable signal; and a flip-flop control circuit, comprising:

a mode control circuit coupled to receive the first and second control signals, the mode control circuit being structured to generate the first mode signal responsive to the first control signal and to generate the second mode signal responsive to the second control signal; and a latch control circuit coupled to the latch and to the input and output circuits, the latch control circuit being structured to generate the input enable signal responsive to a first latch control signal, and to generate the output enable signal and the latch enable signal responsive to a second latch control signal.

25. The memory device of claim 20 wherein the flip-flop comprises:

a latch having at least one input/output ("I/O") terminal, the latch being structured to latch a signal applied to the I/O terminal;

an input circuit coupled to the I/O terminal of the latch, the input circuit being structured to couple the data signal to the I/O terminal; and an output circuit coupled between the I/O terminal of the latch and the single-ended and double-ended output terminals, the output circuit being structured to couple the I/O terminal to the single-ended output terminal responsive to a first mode signal, and to couple the I/O terminal to at least one of the double-ended output terminals responsive to receiving a second mode signal.

26. The memory device of claim 25 wherein the output circuit comprises:

a pair of double-ended output drivers having respective input terminals coupled to the latch and respective output terminals coupled to one of the double-ended output terminals, the double-ended output driver being enabled responsive to the second mode signal; and a single-ended output driver having an input terminal coupled to the latch and an output terminal coupled to the single-ended output terminal, the single-ended output driver being enabled responsive to the first mode signal.

27. The memory device of claim 26 wherein the single-ended output driver comprises:

a first gate enable by the first mode signal and disabled by the second mode signal, the first gate having an output terminal and an input terminal coupled to the I/O terminal of the latch;

a second gate enable by the first mode signal and disabled by the second mode signal; the second gate having an output terminal and an input terminal coupled to the I/O terminal of the latch;

a first transistor coupled between a first voltage reference node and the single-ended output terminal, the first transistor having a control terminal coupled to the output terminal of the first gate; and a second transistor coupled between the single-ended output terminal and a second voltage reference node, the second transistor having a control terminal coupled to the output terminal of the second gate.

28. A computer system, comprising:

a processor having a processor bus;

an input device coupled to the processor through the processor bus and adapted to allow data to be entered into the computer system;

an output device coupled to the processor through the processor bus adapted to allow data to be output from the computer system; and a memory coupled to the processor through the processor bus, the memory device comprising:

at least one array of memory cells adapted to store data at a location determined by an address;

an address circuit adapted to receive and decode an address, and select a plurality of memory cells corresponding to the address;

a command buffer adapted to receive a memory command and to generate control signals corresponding thereto;

a write data path adapted to couple data from an external data terminal to the at least one array of memory cells; and a read data path adapted to couple data from the at least one array of memory cells to the external data terminal, the read data path comprising:

a data output buffer having at least one input terminal and an output terminal coupled to the external data terminal;

a flip flop having at least one input terminal coupled to receive a data signal from the at least one array of memory cells, a single-ended output terminal, a pair of double-ended output terminals, and a control terminal, the flip flop being structured to generate a single-ended output signal at the single-ended output terminal responsive to a first control signal applied to the control terminal, and being structured to generate a double-ended output signal at each of the double-ended output terminals responsive to a second control signal applied to the control terminal, the single-ended output terminal being coupled to the input terminal of the data output buffer;

a test mode circuit having an output coupled to the control terminal of the flip-flop, the test mode circuit being structured to generate the first control signal in a normal operating mode and the second control signal in a test mode; and a compression circuit having a pair of complimentary input terminals coupled to the double-ended output terminals of the flip-flop, the compression circuit having at least one output terminal coupled to an input terminal of the data output buffer.

29. The computer system of claim 28 wherein the command buffer further comprises a mode register structured to store data corresponding to an operating mode, and wherein the mode register is operable to generate the first and second control signals.

30. The computer system of claim 28 wherein the at least one array of memory cells produces complimentary data signals, and wherein the flip-flop comprises a pair of complimentary input terminals coupled to receive the complimentary data signals from the at least one array of memory cells.

31. The computer system of claim 28 wherein the data output buffer comprises complimentary input terminals, and wherein the compression circuit comprises a pair of double-ended output terminals coupled to the complimentary input terminals of the data output buffer.

32. The computer system of claim 28 wherein the flip-flop comprises:

a flip flop circuit comprising:

a latch having at least one input/output ("I/O") terminal, the latch being structured to latch a signal applied to the I/O terminal responsive to a latch enable signal;

an input circuit coupled to the I/O terminal of the latch, the input circuit being structured to couple the data signal to the I/O terminal responsive to an input enable signal; and an output circuit coupled between the I/O terminal of the latch and the single-ended and double-ended output terminals, the output circuit being structured to couple the I/O terminal to the single-ended output terminal responsive to receiving both a first mode signal and a first output enable signal and to couple the I/O terminal to at least one of the double-ended output terminals responsive to receiving both a second mode signal and a second output enable signal; and a flip-flop control circuit, comprising:

a mode control circuit coupled to receive the first and second control signals, the mode control circuit being structured to generate the first mode signal responsive to the first control signal and to generate the second mode signal responsive to the second control signal; and a latch control circuit coupled to the latch and to the input and output circuits, the latch control circuit being structured a generate the input enable signal responsive to a first latch control signal, and to generate the output enable signal and the latch enable signal responsive to a second latch control signal.

33. The computer system of claim 28 wherein the flip-flop comprises:

a latch having at least one input/output ("I/O") terminal, the latch being structured to latch a signal applied to the I/O terminal;

an input circuit coupled to the I/O terminal of the latch, the input circuit being structured to couple the data signal to the I/O terminal; and an output circuit coupled between the I/O terminal of the latch and the single-ended and double-ended output terminals, the output circuit being structured to couple the I/O terminal to the single-ended output terminal responsive to a first mode signal, and to couple the I/O terminal to at least one of the double-ended output terminals responsive to receiving a second mode signal.

34. The computer system of claim 33 wherein the output circuit comprises:

a pair of double-ended output drivers having respective input terminals coupled to the latch and respective output terminals coupled to one of the double-ended output terminals, the double-ended output driver being enabled responsive to the second mode signal; and a single-ended output driver having an input terminal coupled to the latch and an output terminal coupled to the single-ended output terminal, the single-ended output driver being enabled responsive to the first mode signal.

35. The computer system of claim 34 wherein the single-ended output driver comprises:

a first gate enable by the first mode signal and disabled by the second mode signal, the first gate having an output terminal and an input terminal coupled to the I/O terminal of the latch;

a second gate enable by the first mode signal and disabled by the second mode signal; the second gate having an output terminal and an input terminal coupled to the I/O terminal of the latch;

a first transistor coupled between a first voltage reference node and the single-ended output terminal, the first transistor having a control terminal coupled to the output terminal of the first gate; and a second transistor coupled between the single-ended output terminal and a second voltage reference node, the second transistor having a control terminal coupled to the output terminal of the second gate.

36. A method of coupling data from a memory array to an external data terminal while allowing the memory array to be tested, the method comprising:

coupling the data from the memory array to a latching circuit;

storing the data in the latching circuit;

in a normal operating mode, coupling the data from the latching circuit to the external data terminal through a single-ended data path;

in a test mode, coupling the data from the latching circuit to a data compression circuit through a double-ended data path; and coupling test data corresponding to the data coupled to the compression circuit from the compression circuit to the external data terminal.

37. The method of claim 36 wherein the act of coupling test data from the compression circuit to the external data terminal comprises coupling the test data through a double-ended data path.

38. The method of claim 36 wherein the act of coupling the data from the memory array to the latching circuit comprises coupling complimentary data from the memory array to the latching circuit.

39. The method of claim 36 further comprising placing the single-ended data path in a high impedance state in a test mode.

* * * * *

UNITED STATES PATENT AND TRADEMARK OFFICE
CERTIFICATE OF CORRECTION

PATENT NO. : 6,356,487 B1  
DATED : March 12, 2002  
INVENTOR(S) : Todd A. Merritt It is certified that error appears in the above-identified patent and that said Letters Patent is hereby corrected as shown below:

Column 8,
Line 23, reads "abled" should read -- disabled --

Column 9,
Please delete lines 1-13

Column 16,
Line 18, reads "a" should read -- to --

Signed and Sealed this

Eleventh Day of June, 2002

Attest:

Attesting Officer

JAMES E. ROGAN
Director of the United States Patent and Trademark Office